United States Patent [19]
Li et al.

[11] Patent Number: 5,477,181
[45] Date of Patent: Dec. 19, 1995

[54] PROGRAMMABLE MULTIPHASE CLOCK DIVIDER

[75] Inventors: Gabriel Li, San Francisco; Wong Hee, San Jose, both of Calif.

[73] Assignee: National Semiconductor Corporation, Santa Clara, Calif.

[21] Appl. No.: 322,709

[22] Filed: Oct. 13, 1994

[51] Int. Cl.[6] .................................................. H03K 5/15
[52] U.S. Cl. ..................... 327/258; 327/242; 327/269; 377/52
[58] Field of Search ................................ 327/241, 242, 327/258, 269; 377/52, 56

[56] References Cited

U.S. PATENT DOCUMENTS

| | | | |
|---|---|---|---|
| 4,290,022 | 9/1981 | Puckett | 327/241 |
| 4,757,264 | 7/1988 | Lee et al. | 327/241 |
| 4,856,032 | 8/1989 | Klekotka et al. | 377/52 |
| 5,039,950 | 8/1991 | McDermott | 327/258 |
| 5,043,596 | 8/1991 | Masuda et al. | 327/241 |

*Primary Examiner*—John S. Heyman
*Attorney, Agent, or Firm*—Limbach & Limbach

[57] ABSTRACT

A programmable multiphase clock divider for selectively frequency dividing a multiphase input clock to provide a lower-frequency, self-aligned, multiphase output clock includes a counter, combinational logic circuitry, a multiphase signal generator and a multiplexor. With the counter serving as the sole frequency divider element, multiple phase-aligned clock phases are generated which are then programmably multiplexed to provide the desired frequency-divided, self-aligned clock phases. The counter, in response to a preset signal and an input clock phase, generates a multibit count signal, one bit of which forms the first output clock phase. The combinational logic circuitry receives a programming signal for decoding the multibit count signal to generate the counter preset signal and an output control signal. The multiphase signal generator successively latches the first output clock phase with the aforementioned input clock phase and additional input clock phases to generate a number of synchronous, intermediate clock phases. The multiplexor, in response to the output control signal, multiplexes the intermediate clock phases to provide further output clock phases. All of the output clock phases are phase-aligned with one another and are at a lower frequency than that of the input clock phase. Multiple ones of such clock dividers can be programmed to frequency divide by selected prime numbers and cascaded to achieve virtually any desired frequency division ratio while maintaining self-aligned output clock phases.

21 Claims, 18 Drawing Sheets

| FIG. 7A | FIG. 7C | FIG. 7E | FIG. 7G | FIG. 7I | FIG. 7K |
| --- | --- | --- | --- | --- | --- |
| FIG. 7B | FIG. 7D | FIG. 7F | FIG. 7H | FIG. 7J | FIG. 7L |

KEY TO FIG. 7

PROGRAMMABLE MULTIPHASE CLOCK DIVIDER

BACKGROUND OF THE INVENTION

1. Field of the Invention

The present invention relates to frequency divider circuits, and in particular, multiphase clock dividers for frequency dividing multiphase clock signals simultaneously.

2. Description of the Related Art

Many types of frequency dividers are well known in the art, including those that are programmable for allowing the frequency division ratio to be selected and varied. One application for frequency dividers is in digital phase lock loops where a frequency divider is often used for frequency dividing the clock signal from a reference oscillator and/or the feedback signal from the loop oscillator. A problem with such applications, however, is the effect upon the dynamic operation characteristics of the phase lock loop when a divider, and in particular, a programmable divider, is inserted within the loop. The loop dynamics change every time the frequency divider is reprogrammed. Furthermore, such effects upon the loop dynamics become even more complicated when multiphase signals must be divided.

For example, where multiphase signals are to be divided and the mutual phase relationships among the various clock phases are important, a problem which arises is that of how to frequency divide all of the phases while maintaining their mutual phase alignments and synchronization. Using a divider for each phase introduces variances among those phase relationships. Plus, depending upon the type of divider used, permanent phase errors can result if one or more of the phases experiences a "phase flip," from which it/they may never recover.

Accordingly, it would be desirable to have an improved technique for frequency dividing, and in particular, programmably frequency dividing, multiphase clock signals while maintaining the original phase alignment of the original clock signals.

SUMMARY OF THE INVENTION

A programmable multiphase clock divider in accordance with one embodiment of the present invention includes a frequency divider and a clock generator for selectively frequency dividing a multiphase input clock to provide a lower-frequency, self-aligned, multiphase output clock. The frequency divider receives a first input clock phase at an input clock frequency plus a programming signal, and in accordance with these signals provides a first output clock phase at an output clock frequency and an output control signal, with the output clock frequency being lower than that of the input clock frequency. The clock generator also receives the first input clock phase plus the first output clock phase, the output control signal and additional input clock phases at the input clock frequency, and in accordance with these signals provides additional output clock phases at the output clock frequency, with the output clock phases all being phase-aligned.

In accordance with a preferred embodiment of the present invention, the frequency divider includes a counter and combinational logic circuitry, and the clock generator includes a multiphase signal generator and a multiplexor. The counter receives a preset signal and the first input clock phase and in accordance therewith provides a multibit count signal, with a portion of the multibit count signal forming the first output clock phase. The combinational logic circuitry receives the multibit count signal and programming signal and in accordance therewith provides the preset signal. The multiphase signal generator receives the first input clock phase, the first output clock phase and the additional input clock phases and in accordance therewith provides a number of intermediate clock phases. The multiplexor multiplexes the intermediate clock phases in accordance with the output control signal to provide the additional output clock phases.

These and other features and advantages of the present invention will be o understood upon consideration of the following detailed description of the invention and the accompanying drawings.

DETAILED DESCRIPTION OF THE INVENTION

Figure 1:
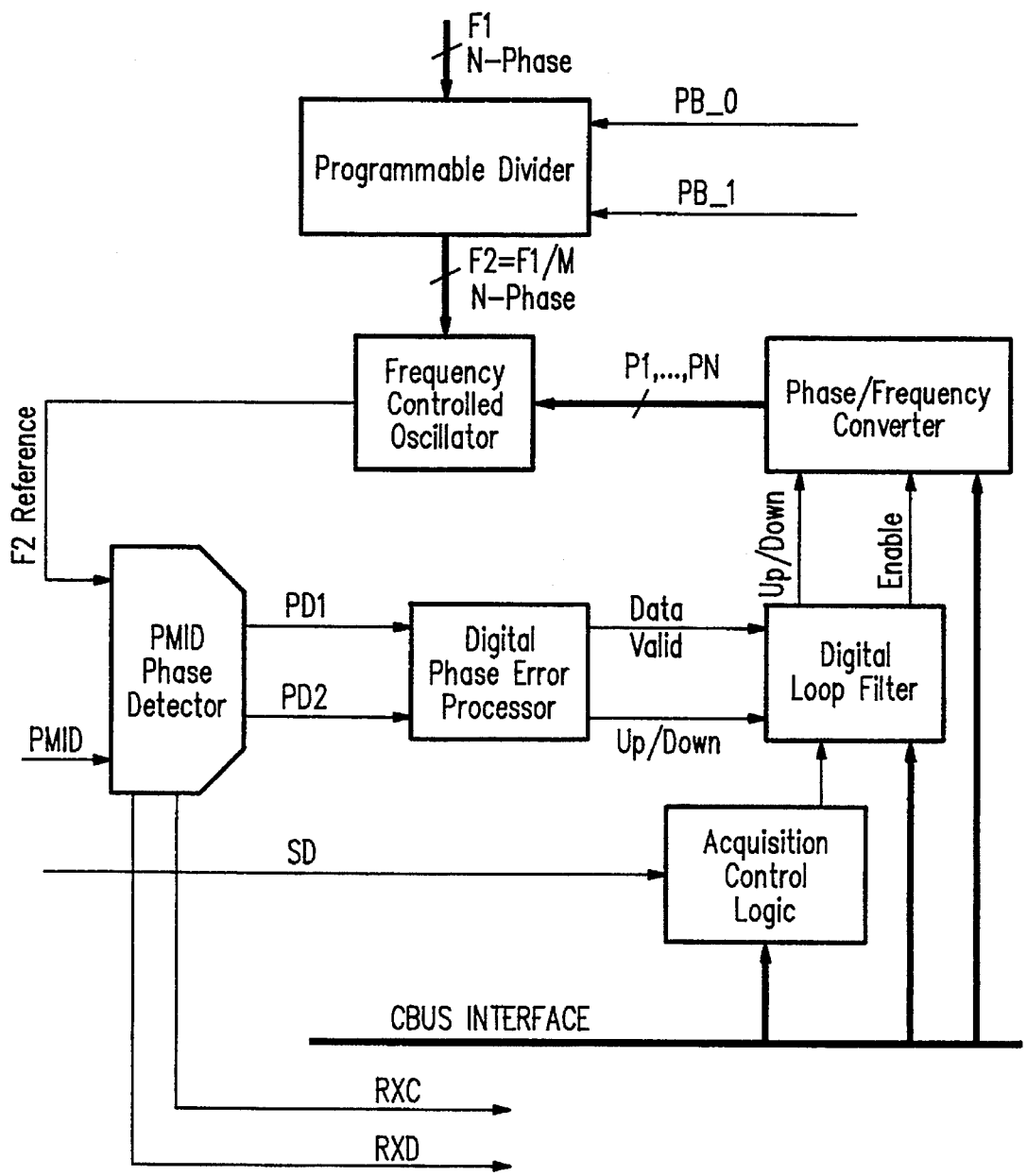
FIG. 1 is a functional block diagram of a digital phase lock loop with a programmable multiphase clock divider in accordance with the present invention external to the loop.

Referring to FIG. 1, when used with a digital phase lock loop, a programmable multiphase clock divider in accordance with the present invention can be operated externally to the loop. The desired signals are frequency divided outside the loop with the resultant frequency-divided signals then introduced into the loop. For example, as shown, an N-phase signal at frequency F1 is programmably divided to produce an N-phase, frequency-divided output signal at frequency F2 (where F2=F1/M and M is programmable) for use by the frequency controlled oscillator within the digital phase lock loop.

Figure 2:
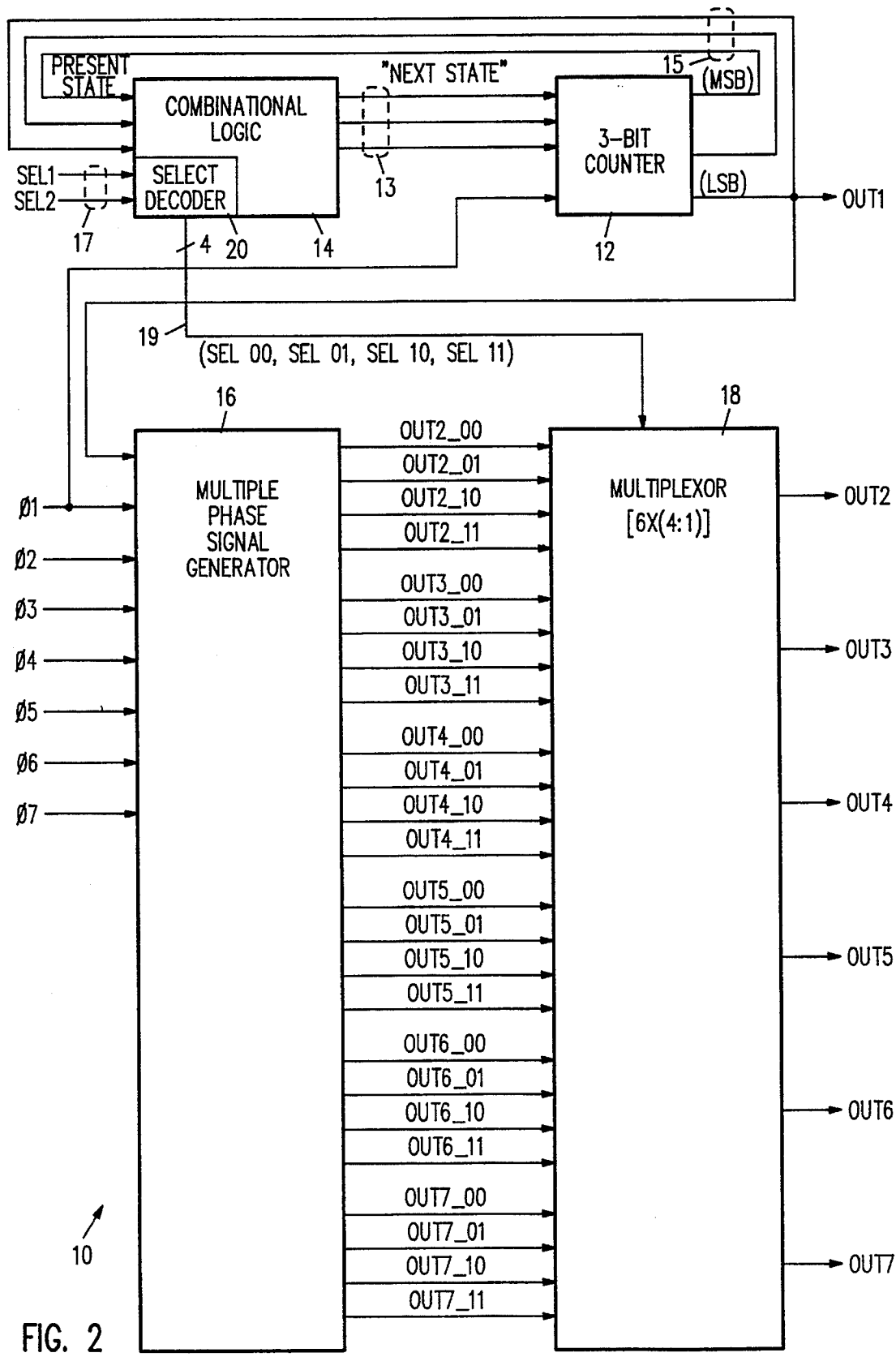
FIG. 2 is a functional block diagram of a programmable multiphase clock divider in accordance with one embodiment of the present invention.

Referring to FIG. 2, a programmable multiphase clock divider 10 in accordance with one embodiment of the present invention includes a counter 12, combinational logic circuitry 14, a multiphase signal generator 16 and a multiplexor 18, all connected substantially as shown. As discussed further below, this particular clock divider 10 can be programmed to frequency divide a seven-phase clock having phases ph1, ph2, ph3, ph4, ph5, ph6 and ph7 ("φ1, φ2, φ3, φ4, φ5, φ6 and φ7") while maintaining the original phase relationships among the input phases φ1–φ7. However, it should be understood from the following discussion that other clock dividers in accordance with the present invention can be realized which can programmably frequency divide clock signals having more or less than seven phases. For example, while the counter 12 in the divider 10 of FIG. 2 is a three-bit counter (since the input multiphase clock consists of seven phases φ1–φ7), other clock dividers in accordance with the present invention can be realized to frequency divide a multiphase clock having other than seven phases by using a counter 12 which counts with other than three bits; e.g. an N-bit counter for M phases where $2^{N-1}<M<2^N$.

The counter 12 receives a counter preset signal 13 which is clocked into the counter 12 by the first, or leading, phase φ1 of the input multiphase clock. The resulting multibit count signal 15 outputted by the counter 12 is fed back to the combinational logic 14. This count signal 15 serves as a "present state" input for the combinational logic 14 which is then logically processed in accordance with a two-bit programming input 17 to produce a "next state" signal as the counter preset signal 13. The least significant bit LSB of the multibit count signal 15 forms the first, or leading, output clock phase OUT1 which is synchronous to and frequency-divided down from the first input clock phase φ1.

As discussed further below, the two-bit programming input 17 to the combinational logic 14 includes two select bits SEL1, SEL2 which determine the frequency divide ratio for the clock divider 10 ("00" for ÷2; "10" for ÷3; "01" for "5; and "11" for ÷7). In addition to being used by the combinational logic 14 for converting the count signal 15 to the preset signal 13, the programming bits SEL1, SEL2 are also decoded by a select decoder 20 within the combinational logic 14 to generate a four-bit output control signal 19 for use by the multiplexor 18 (discussed further below).

The multiphase signal generator 16 receives the first output clock phase OUT1 from the counter 12 and all phases φ1–φ7 of the multiphase input clock. The input clock phases φ1–φ7 are used to selectively clock the first output clock phase OUT1 to generate a number of intermediate clock phases OUT2_00, OUT2_01, OUT2_10, OUT2_11, OUT3_00, OUT3_01, OUT3_10, OUT3_11, OUT4_00, OUT4_01, OUT4_10, OUT4_11, OUT5_00, OUT5_01, OUT5_10, OUT5_11, OUT6_00, OUT6_01, OUT6_10, OUT6_11, OUT7_00, OUT7_01, OUT7_10, OUT7_11 ("OUT2_mn, OUT3_mn, OUT4_mn, OUT5_mn, OUT6_mn, OUT7_mn" where m,n∈{0, 1}). As discussed further below, these intermediate clock phases OUT2_mn, OUT3_mn, OUT4_mn, OUT5_mn, OUT6_mn, OUT7_mn are generated by the multiphase signal generator 16 by sampling (e.g. latching) the first output clock phase OUT1 with a selected group of the input clock phases φ1–φ7. In turn, those sampled (e.g. latched) clock phases are then successively further sampled with further groups of the input clock phases φ1–φ7.

The intermediate clock phases OUT2_mn, OUT3_mn, OUT4_mn, OUT5_mn, OUT6_mn, OUT7_mn are inputted to the multiplexor 18 which, in accordance with the aforementioned output control signal 19, selectively multiplexes them to produce six additional output clock phases OUT2–OUT7. Functionally, the multiplexor 18 consists of six 4:1 (four-to-one) multiplexors for multiplexing six groups of four inputs (OUT2_00, OUT2_01, OUT2_10, OUT2_11; OUT3_00, OUT3_01, OUT3_10, OUT3_11; OUT4_00, OUT4_01, OUT4_10, OUT4_11; OUT5_00, OUT5_01, OUT5_10, OUT5_11; OUT6_00, OUT6_01, OUT6_10, OUT6_11; and OUT7_00, OUT7_01, OUT7_10, OUT7_11) to produce the six other output clock phases OUT2–OUT7.

Figure 3:
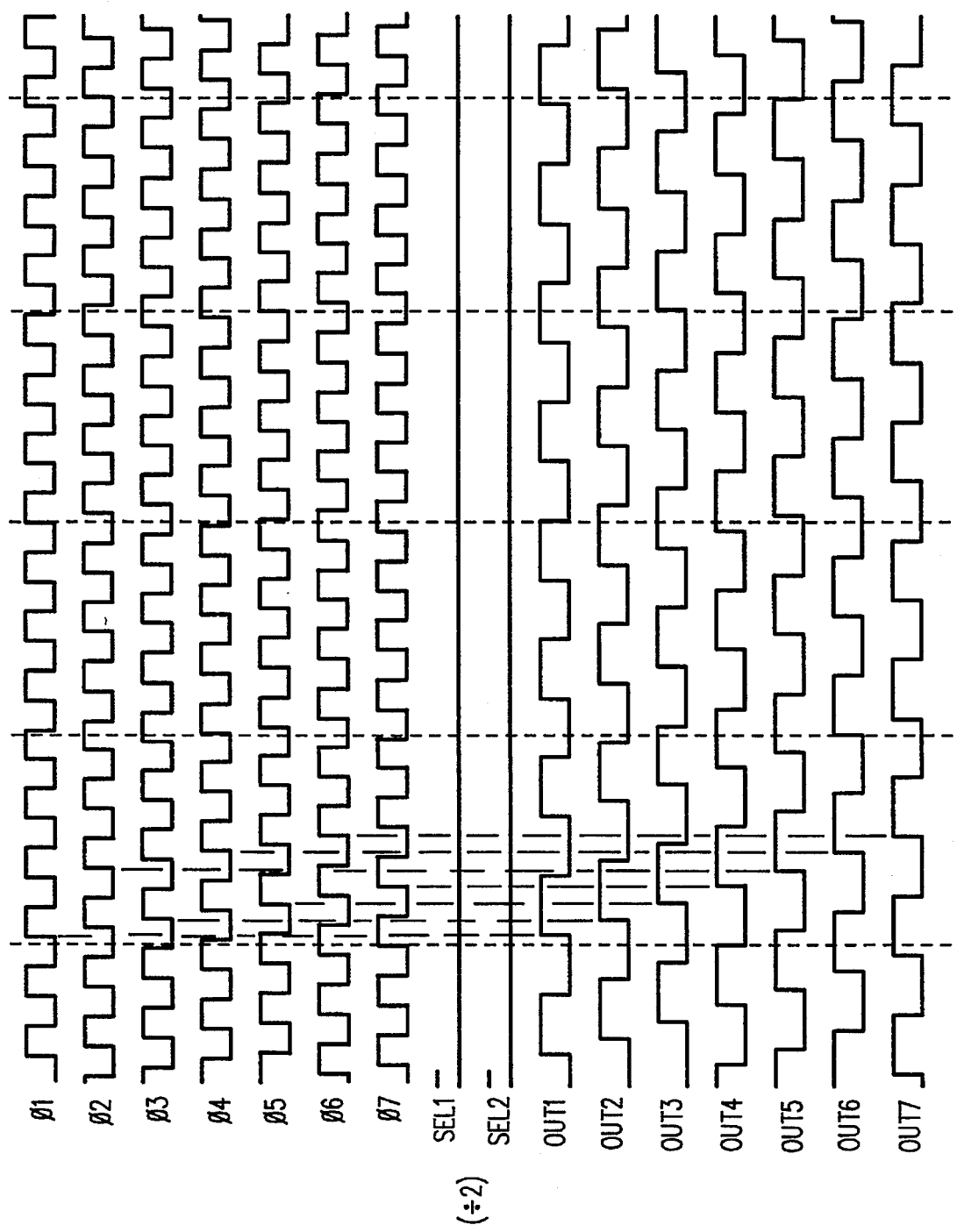
FIG. 3 is a timing diagram of the input and output clock phases for the clock divider of FIG. 2 when programmed to divide by 2.

Referring to FIG. 3, the timing relationships among the input φ1–φ7 and output OUT1–OUT7 clock phases when the clock divider 10 is programmed to divide by 2 are as shown. The input programming bits SEL1, SEL2 are each a logical 0 and the duty cycles of the output clock phases OUT1–OUT7 are each ½. The first output clock phase OUT1 is synchronous, i.e. aligned in phase, with the first input clock phase φ1. The second output clock phase OUT2 is synchronous with the third input clock phase φ3. The third output clock phase OUT3 is synchronous with the fifth input clock phase φ5. The fourth output clock phase OUT4 is synchronous with the seventh input clock phase φ7. The fifth output clock phase OUT5 is synchronous with the second input clock phase φ2. The sixth output clock phase OUT6 is synchronous with the fourth input clock phase φ4. The seventh output clock phase OUT7 is synchronous with the sixth input clock phase φ6.

Figure 4:
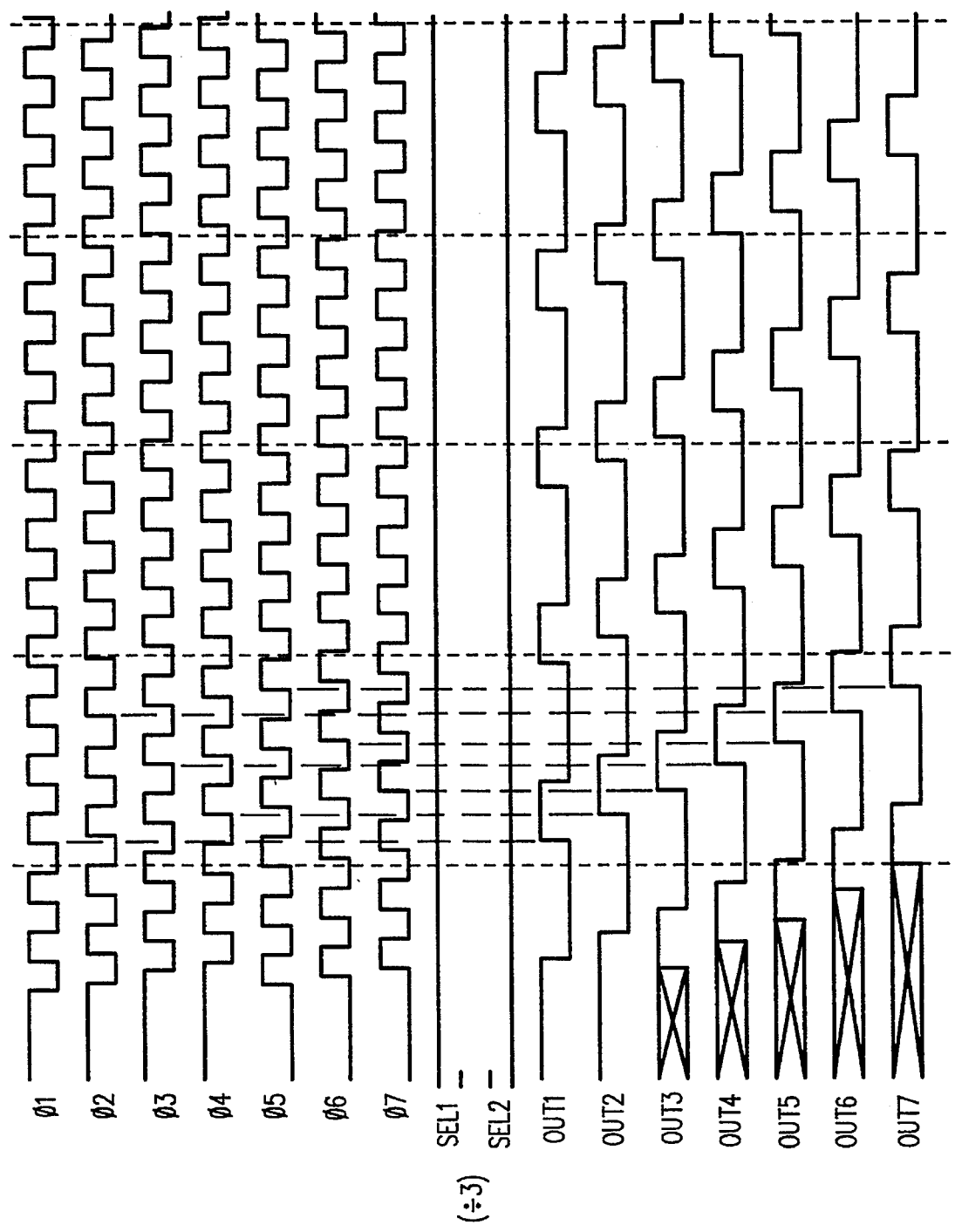
FIG. 4 is a timing diagram of the input and output clock phases for the clock divider of FIG. 2 when programmed to divide by 3.

Referring to FIG. 4, the phase relationships among the input φ1–φ7 and output OUT1–OUT7 clock phases are shown for when the clock divider 10 is programmed to divide by 3. The input programming bits SEL1 and SEL2 are logical 1 and 0, respectively, and the duty cycle of the output clock phases OUT1–OUT7 are each ⅓. The first output clock phase OUT1 is synchronous, i.e. aligned in phase, with the first input clock phase φ1. The second output clock phase OUT2 is synchronous with the fourth input clock phase φ4. The third output clock phase OUT3 is synchronous with the seventh input clock phase φ7. The fourth output clock phase OUT4 is synchronous with the third input clock phase φ3. The fifth output clock phase OUT5 is synchronous with the sixth input clock phase φ6. The sixth output clock phase OUT6 is synchronous with the second input clock phase φ2. The seventh output clock phase OUT7 is synchronous with the fifth input clock phase φ5.

Figure 5:
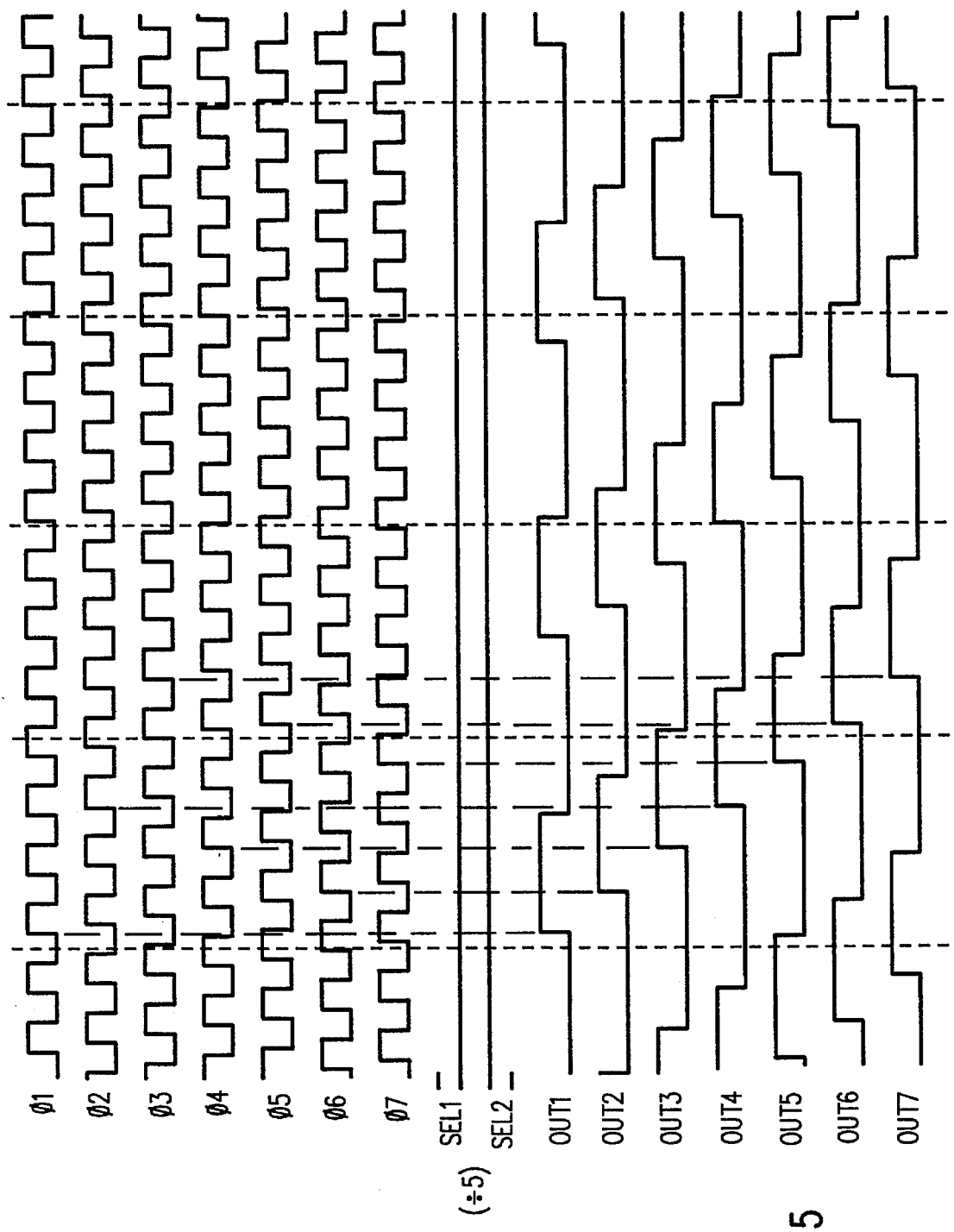
FIG. 5 is a timing diagram of the input and output clock phases for the clock divider of FIG. 2 when programmed to divide by 5.

Referring to FIG. 5, the phase relationships among the input φ1–φ7 and output OUT1–OUT7 clock phases are shown for when the clock divider 10 is programmed to divide by 5. The input programming bits SEL1 and SEL2 are logical 0 and 1, respectively, and the duty cycles of the output clock phases OUT1–OUT7 are each ⅖. The first output clock phase OUT1 is synchronous, i.e. aligned in phase, with the first input clock phase φ1. The second output clock phase OUT2 is synchronous with the sixth input clock phase φ6. The third output clock phase OUT3 is synchronous with the fourth input clock phase φ4. The fourth output clock phase OUT4 is synchronous with the second input clock phase φ2. The fifth output clock phase OUT5 is synchronous with the seventh input clock phase φ7. The sixth output clock phase OUT6 is synchronous with the fifth input clock phase φ5. The seventh output clock phase OUT 7 is synchronous with the third input clock phase φ3.

Figure 6:
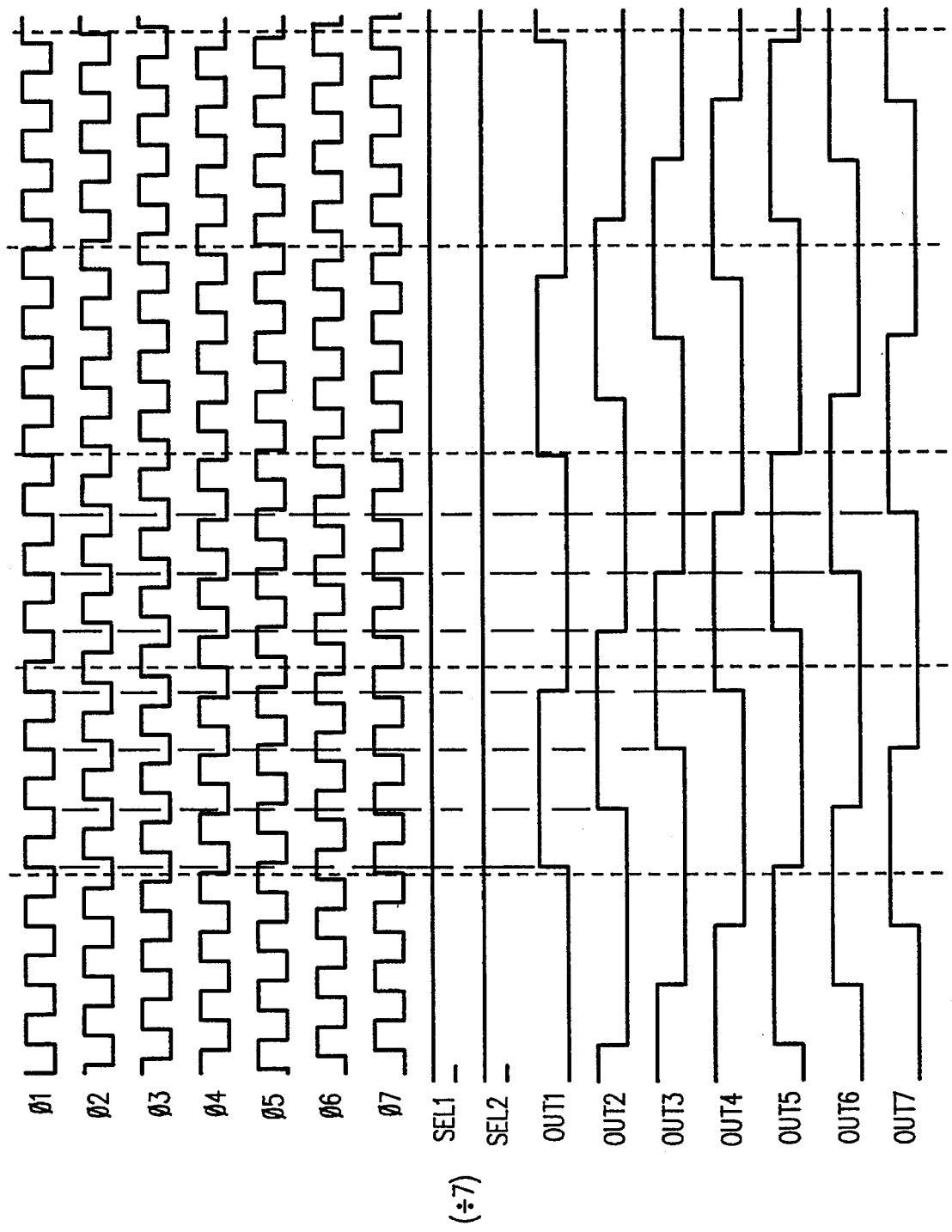
FIG. 6 is a timing diagram of the input and output clock phases for the clock divider of FIG. 2 when programmed to divide by 7.

Referring to FIG. 6, the phase relationships among the input φ1–φ7 and output OUT1–OUT7 clock phases are shown for when the clock divider 10 is programmed to divide by 7. The input programming bits SEL1 and SEL2 are each a logical 1, and the duty cycle of each of the output clock phases OUT1–OUT7 is 3/7. For division by 7, all seven of the output clock phases are synchronous, i.e. aligned in phase, with the first input clock phase φ1, with each successive output clock phase OUT(N) being delayed in phase by one cycle of the input clock phase φ1 from the prior output clock phase OUT(N−1).

In accordance with the foregoing discussion, the clock divider 10 is preferably programmed to divide by a prime number, such as 2, 3, 5 or 7. It should be appreciated that by dividing by prime numbers, multiple clock dividers 10 can be connected in cascade to create virtually any divide ratio while maintaining the relative phase alignment among the input clock phases φ1–φ7.

It should be further understood that the duty cycles illustrated for the output clock phases OUT1–OUT7 in FIGS. 3–6 are merely examples. Depending upon the programmed divide ratio and desired output clock characteristics, these duty cycles can be varied.

Figure 7A:
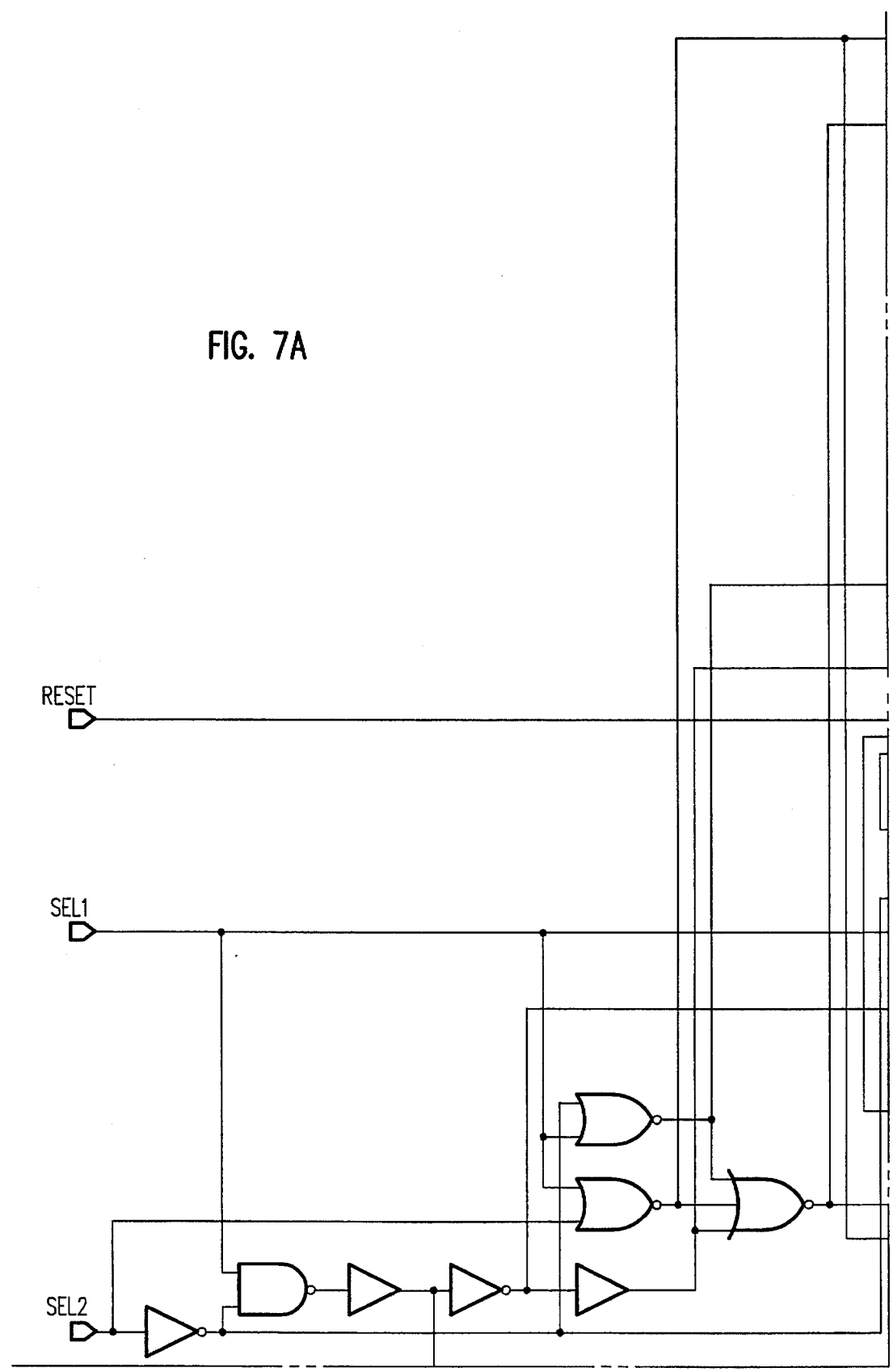
FIG. 7 together with 7A–7L form a logic diagram for a programmable multiphase clock divider in accordance with one embodiment of the present invention.
Figure 7B:
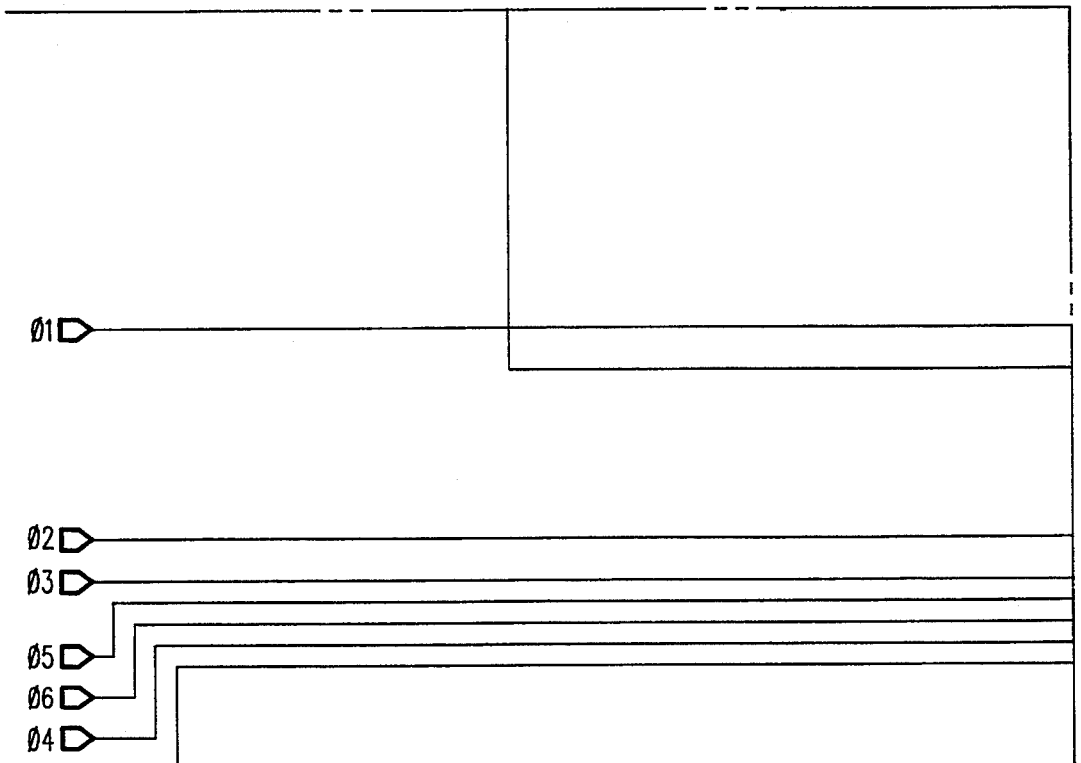
Figure 7C:
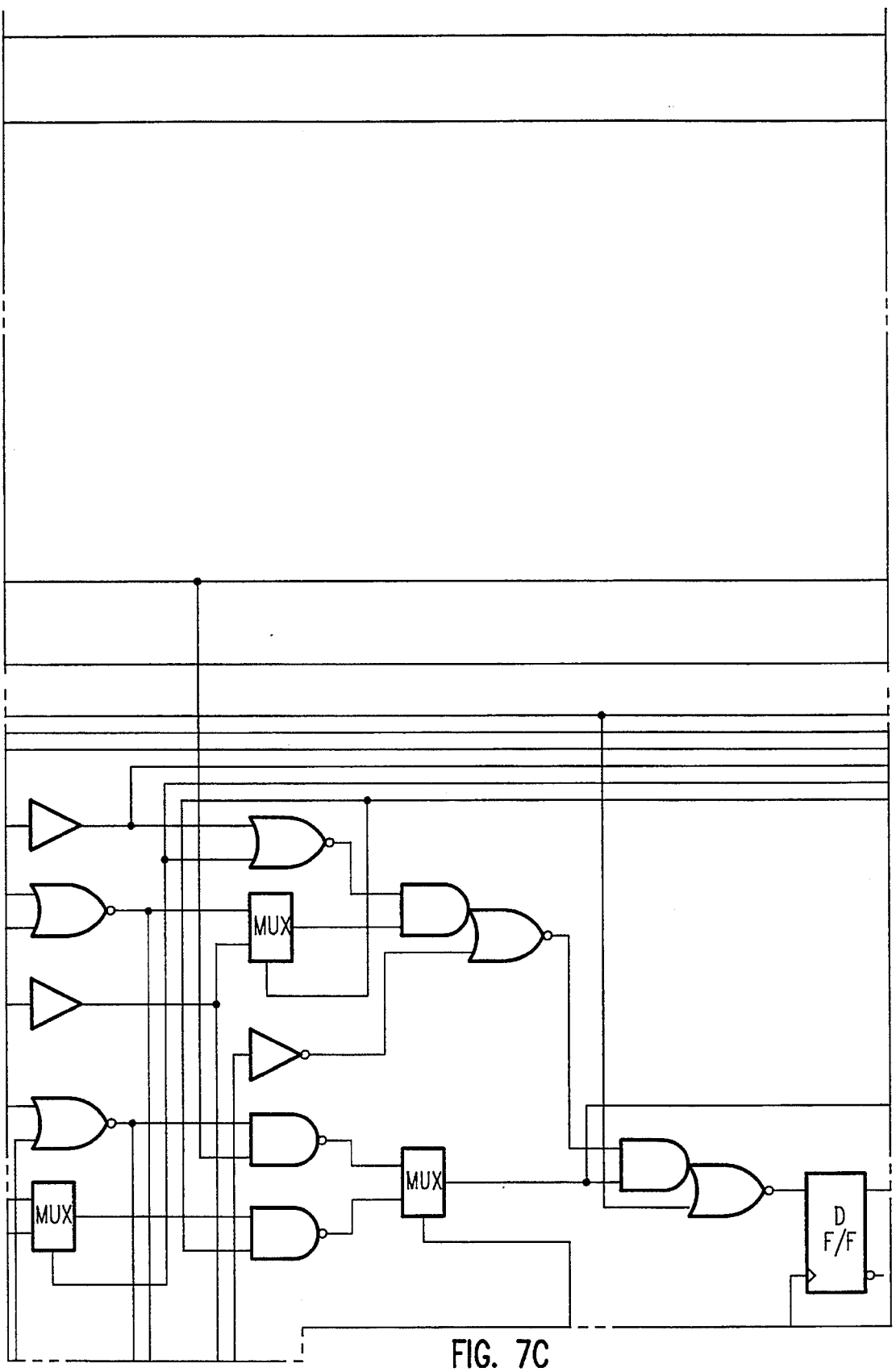
Figure 7D:
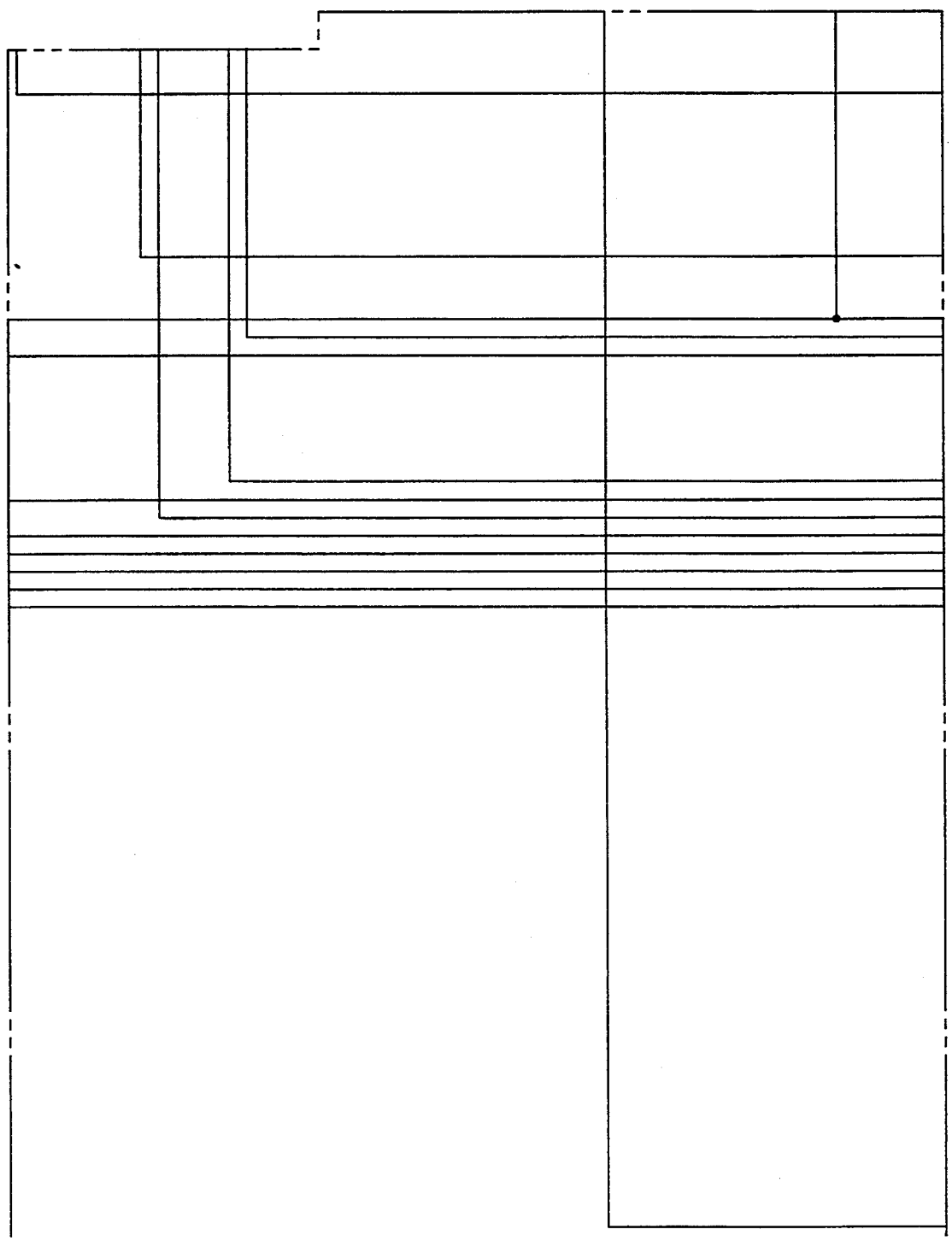
Figure 7E:
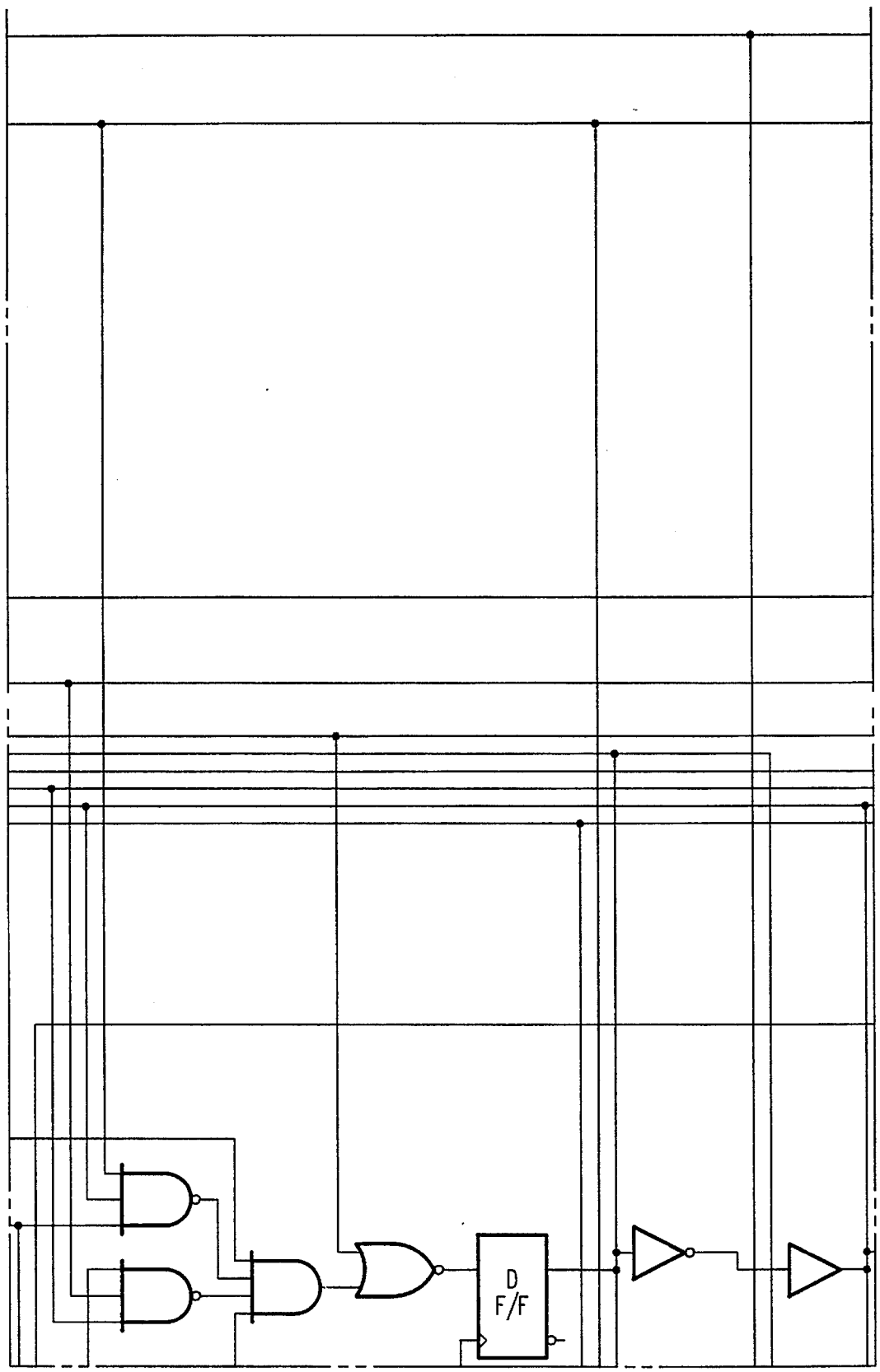
Figure 7F:
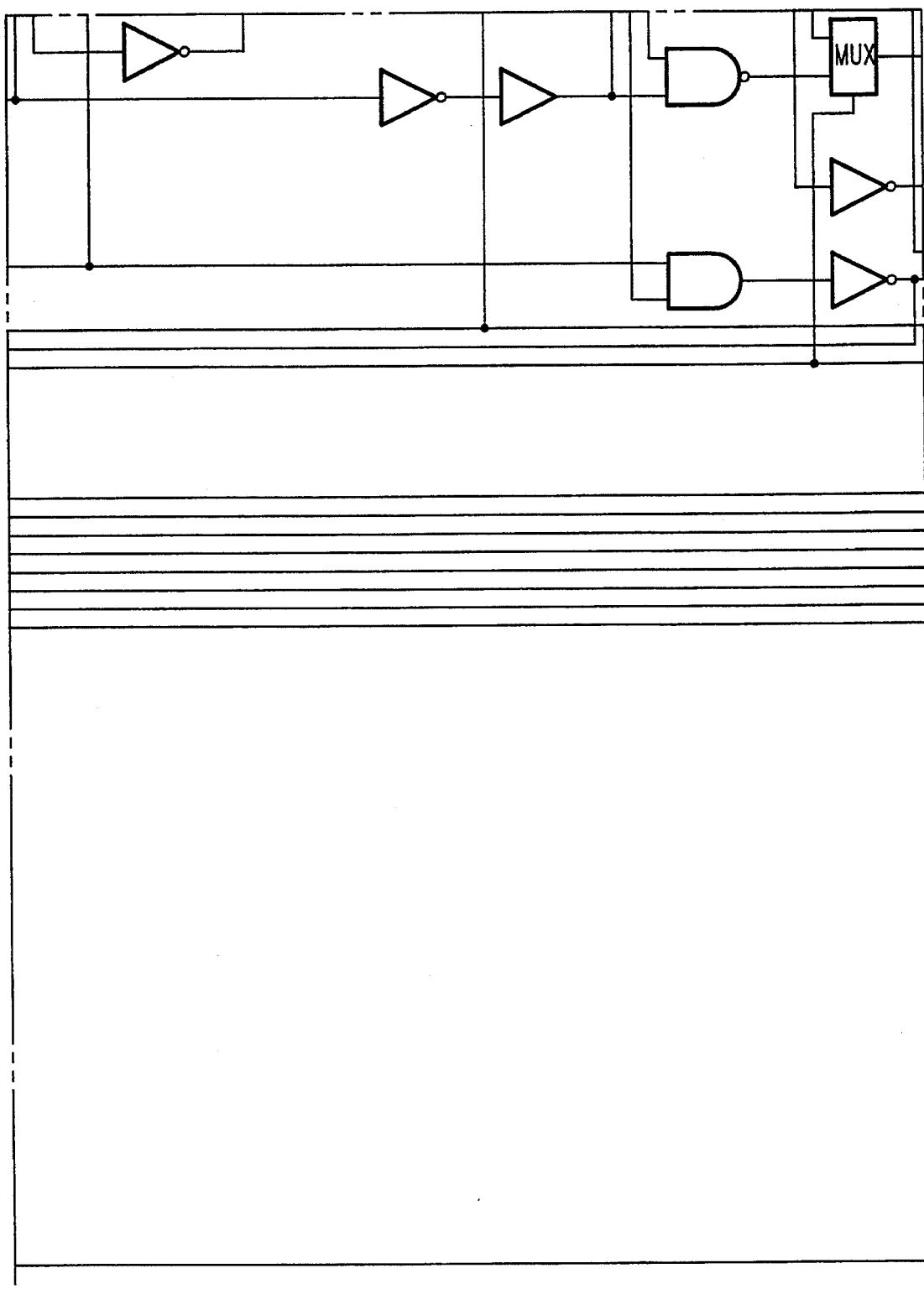
Figure 7G:
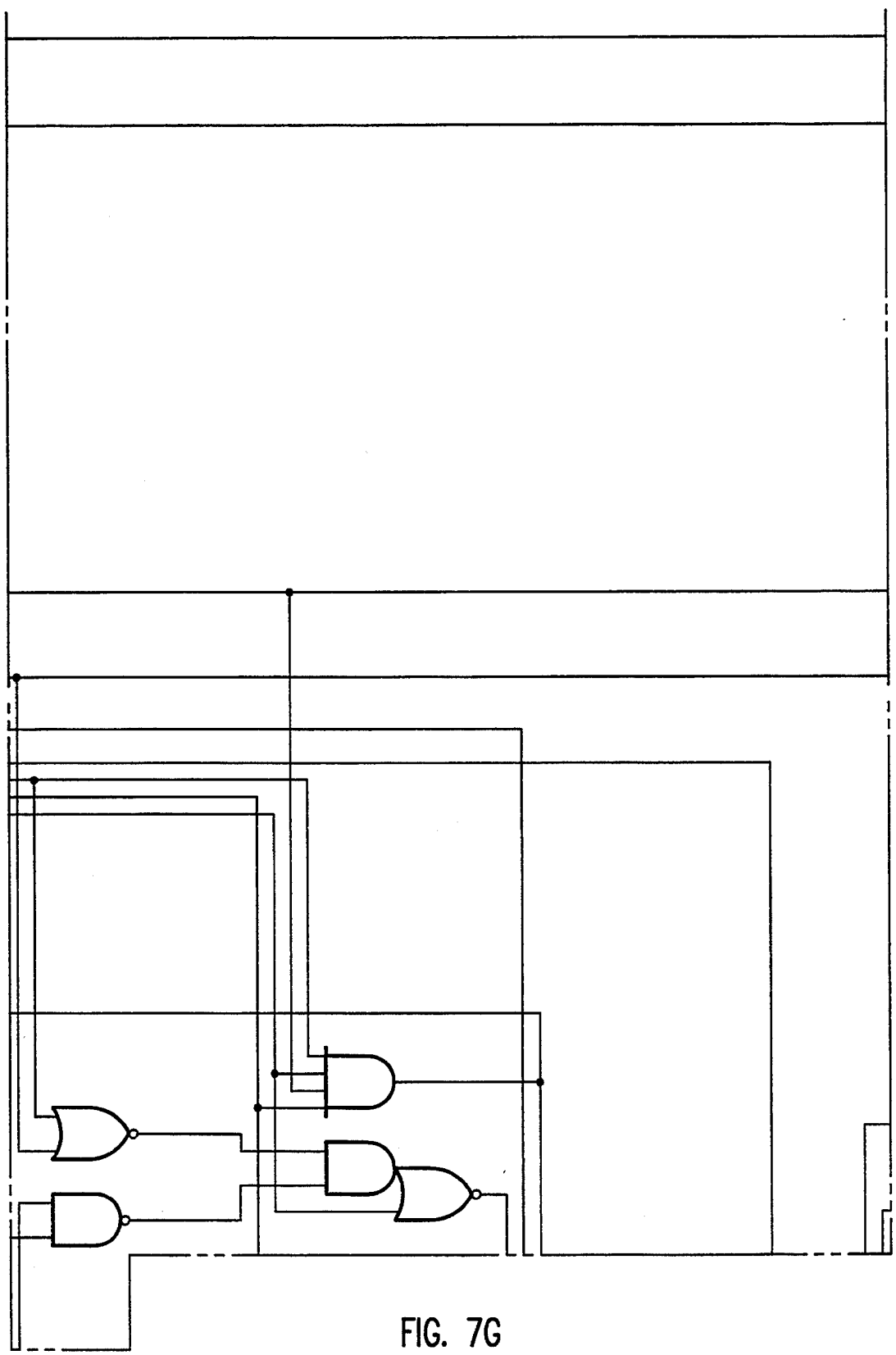
Figure 7H:
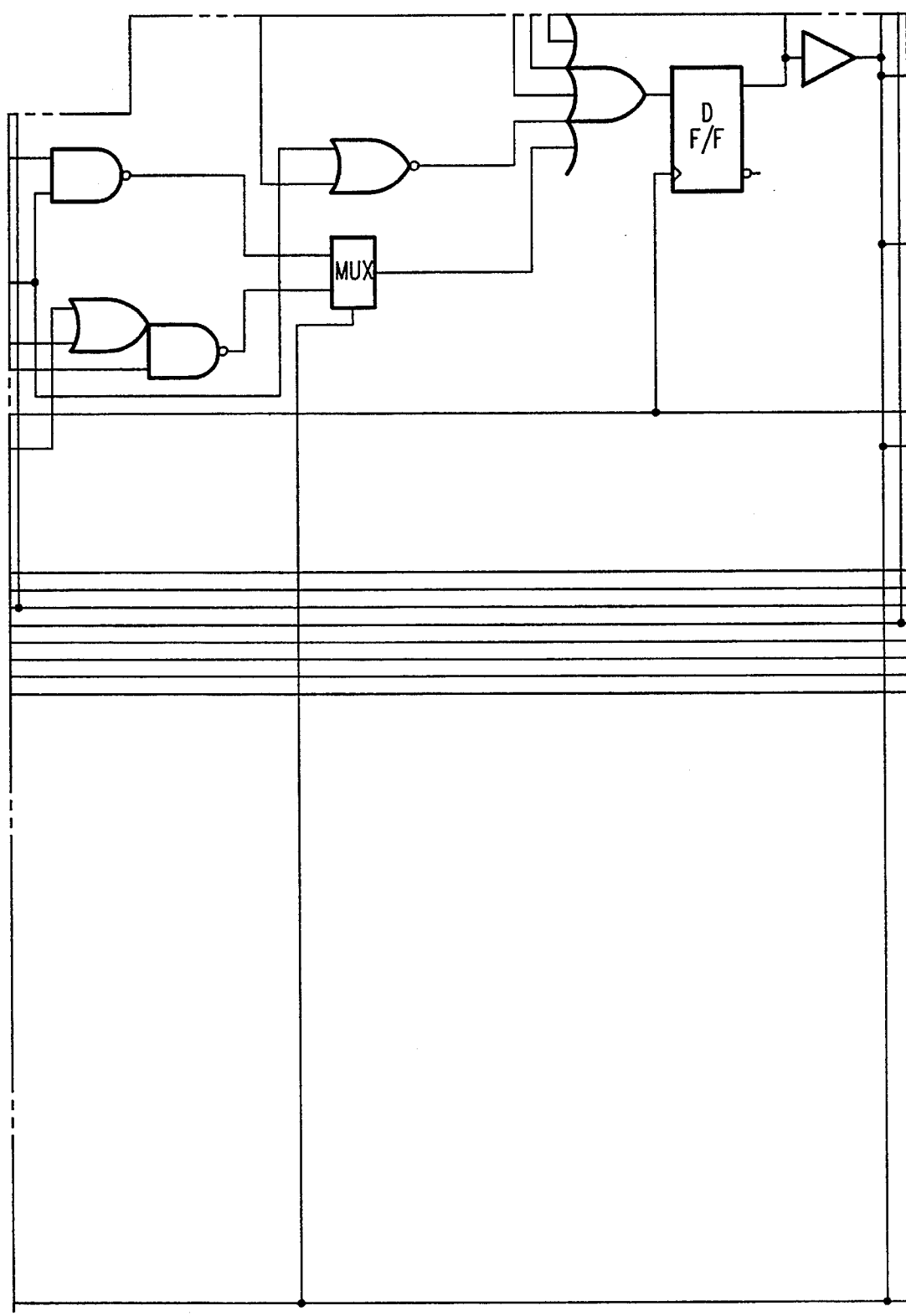
Figure 7I:
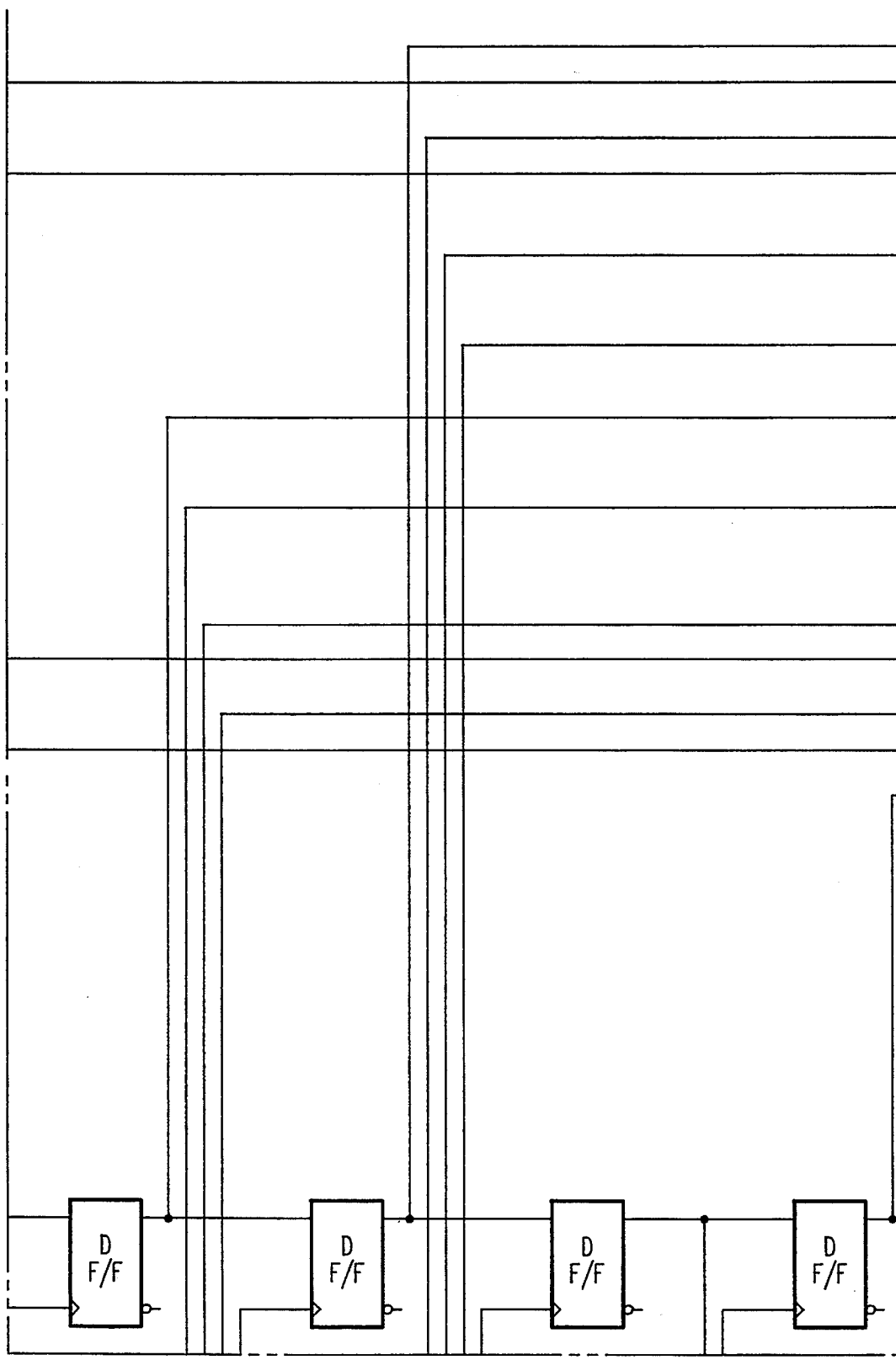
Figure 7J:
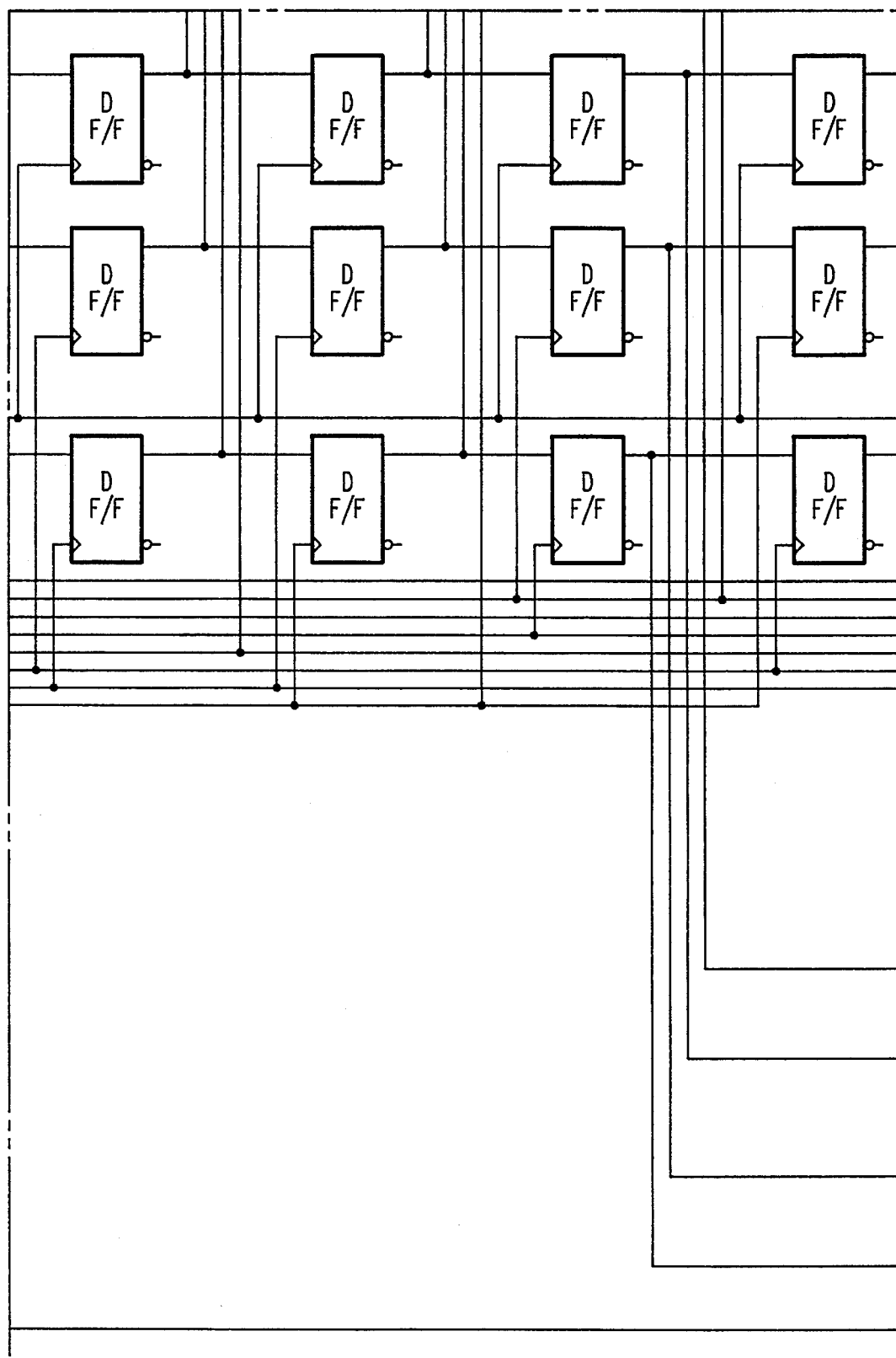
Figure 7K:
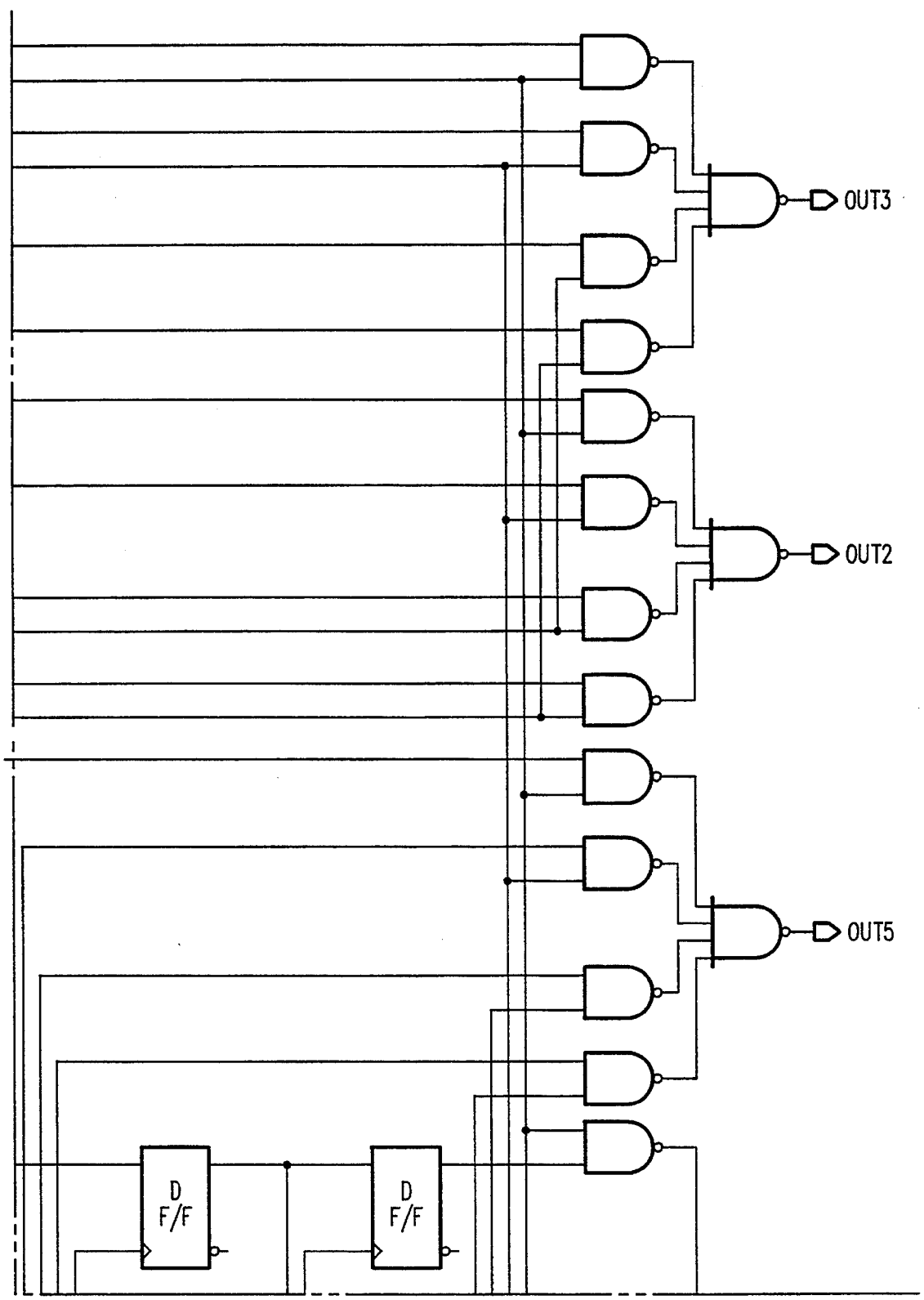
Figure 7L:
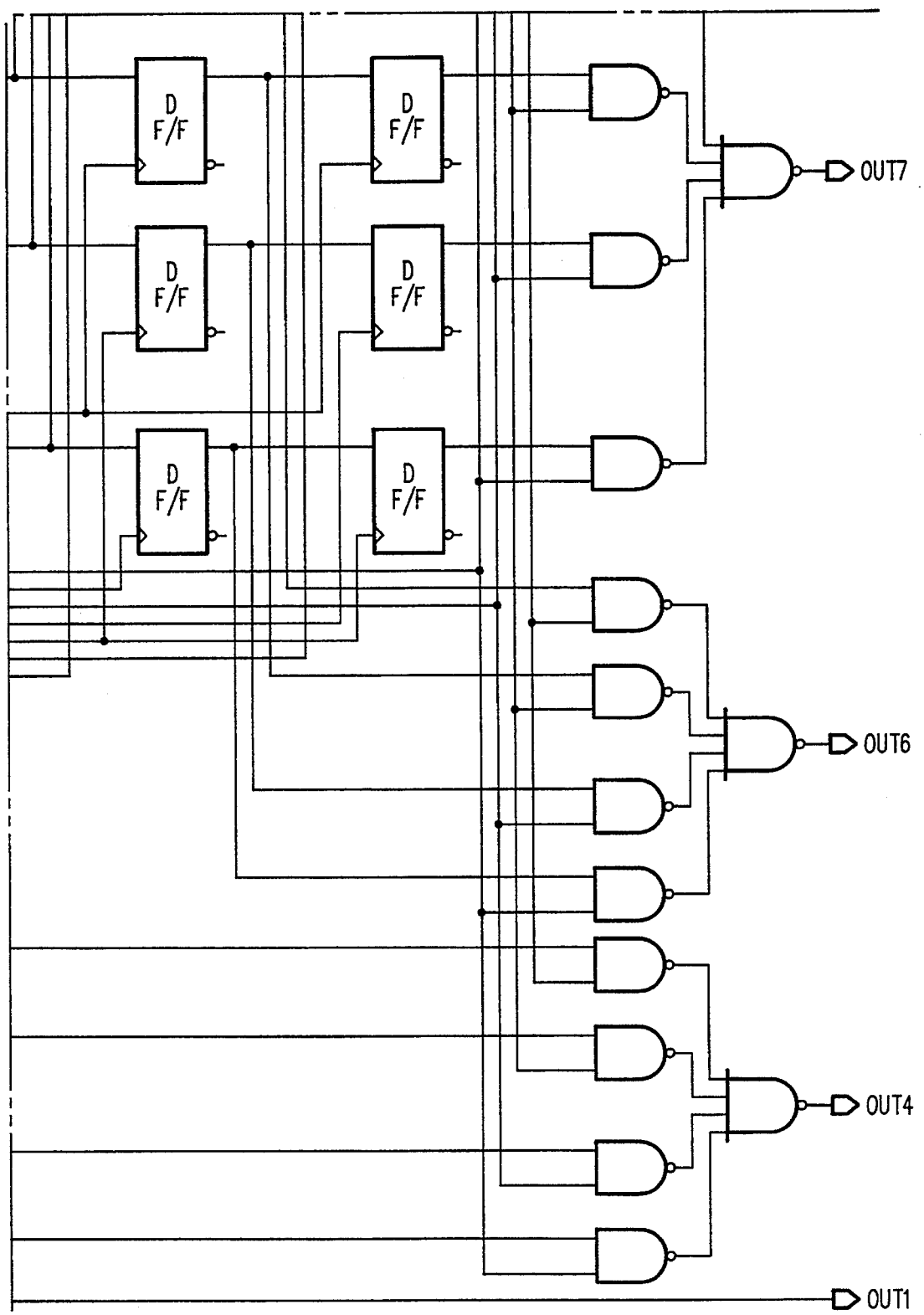

Referring to FIGS. 7A and 7B, the clock divider 10 of FIG. 2 can be realized with logic elements interconnected as shown. FIG. 7A is a logic diagram of a three-bit counter and combinational logic with a select decoder, and FIG. 7B is a logic diagram of a multiple phase signal generator and multiplexor. As discussed above, the combinational logic and select decoder receive the programming bits SEL1, SEL2 and in accordance therewith convert the count signal 15 to the preset signal 13 and generate a four-bit output control signal 19 for use by the multiplexor 18 (see FIG. 2). Meanwhile, the counter receives phase φ1 of the input multiphase clock and in accordance with the programming bits SEL1, SEL2 generates the first output clock phase OUT1. The multiple phase signal generator receives all phases φ1–φ7 of the multiphase input clock and the first output clock phase OUT1 and in accordance therewith generates the intermediate clock phases OUT2_mn, OUT3_mn, OUT4_mn, OUT5_mn, OUT6_mn, OUT7_mn. The multiplexor, in accordance with the output control signal 19 (provided by the select decoder 20 per the programming bits SEL1, SEL2), multiplexes the intermediate clock phases OUT2_mn, OUT3_mn, OUT4_mn, OUT5_mn, OUT6_mn, OUT7_mn to provide the remaining output clock phases OUT2–OUT7 as outlined below in Table 1.

TABLE I

| If: | Then: | And: |
| --- | --- | --- |
| SEL=00 | SEL_00 is asserted | OUT2=OUT2_00 |
| | | OUT3=OUT3_00 |

TABLE I-continued

| If: | Then: | And: |
| --- | --- | --- |
| | | OUT4=OUT4_00 |
| | | OUT5=OUT5_00 |
| | | OUT6=OUT6_00 |
| | | OUT7=OUT7_00 |
| SEL=01 | SEL_01 is asserted | OUT2=OUT2_01 |
| | | OUT3=OUT3_01 |
| | | OUT4=OUT4_01 |
| | | OUT5=OUT5_01 |
| | | OUT6=OUT6_01 |
| | | OUT7=OUT7_01 |
| SEL=10 | SEL_10 is asserted | OUT2=OUT2_10 |
| | | OUT3=OUT3_10 |
| | | OUT4=OUT4_10 |
| | | OUT5=OUT5_10 |
| | | OUT6=OUT6_10 |
| | | OUT7=OUT7_10 |
| SEL=11 | SEL_11 is asserted | OUT2=OUT2_11 |
| | | OUT3=OUT3_11 |
| | | OUT4=OUT4_11 |
| | | OUT5=OUT5_11 |
| | | OUT6=OUT6_11 |
| | | OUT7=OUT7_11 |

The logic design for the clock divider 10 is shown in FIGS. 7A and 7B was designed using a logic design program based upon a Hardware Description Language ("HDL") code, such as VERILOG. A listing of this code is shown below in Table 2.

TABLE 2

```
module phdiv (reset ph1, ph2, ph3, ph4, ph5, ph6, ph7, sel1, sel2, out1,    {LINE 1}
    out2, out3, out4, out5, out6, out7);
    output out1, out2, out3, out4, out5, out6, out7;
    input reset, ph1, ph2, ph3, ph4, ph5, ph6, ph7, sel1, sel2;
    reg out2, out3, out4, out5, out6, out7;
    reg out2_00, out2_10, out2_01, out2_11;
    reg out3_00, out3_10, out3_01, out3_11;
    reg out4_00, out4_10, out4_01, out4_11;
    reg out5_00, out5_10, out5_01, out5_11;
    reg out6_00, out6_10, out6_01, out6_11;
    reg out7_00, out7_10, out7_01, out7_11;
    wire ph1, ph2, ph3, ph4, ph5, ph6, ph7, sel1, sel2;
    reg [2:0] curr, next;                                                    {LINE 13}
    assign out1 = curr[0];                                                   {LINE 14}
    always @(posedge ph1)                                                    {LINE 15}
    begin
        if (reset == 1)
            curr <= 3'b001;
        else curr <= next;
    end                                                                      {LINE 20}
    always @ (cuff or sel1 or sel2)                                          {LINE 21}
    begin
        if (sel1 == 0 && sel2 =0)
            begin
                case (curr)
                    3'b001: next = 3'b110;
                    3'b110: next = 3'b001;
                    default: next = 3'b001;
                endcase
            end                                                              {LINE 30}
        else if (sel1 == 1 && sel2 == 0)                                     {LINE 31}
            begin
                case (curr)
                    3'b001: next = 3'b010;
                    3'b010: next = 3'b100;
                    3'b100: next = 3'b001;
                    default: next = 3'b001;
                endcase
            end                                                              {LINE 39}
        else if (sel1 == 0 && sel2 == 1)                                     {LINE 40}
            begin
```

TABLE 2-continued

```
                    case (curr)
                        3'b001: next = 3'b011;
                        3'b011: next = 3'b000;
                        3'b000: next = 3'b110;
                        3'b110: next = 3'b100;
                        3'b100: next = 3'b001;
                        default: next = 3'b001;
                    endcase
                end                                             {LINE 50}
            else if (sel1 == 1 && sel2 == 1)                    {LINE 51}
                begin
                    case (curr)
                        3'b001: next = 3'b101;
                        3'b101: next = 3'b011;
                        3'b011: next = 3'b110;
                        3'b110: next = 3'b000;
                        3'b000: next = 3'b100;
                        3'b100: next = 3'b010;
                        3'b010: next = 3'b001;
                        default: next = 3'b001;
                    endcase
                end                                             {LINE 63}
end
always @(posedge ph2)                                           {LINE 65}
begin
    out5_00 <= out4_00;
    out6_10 <= out5_10;
    out4_01 <= out3_01;
end                                                             {LINE 70}
always @(posedge ph3)                                           {LINE 71}
begin
    out2_00 <= curr[0];
    out4_10 <= out3_10;
    out7_01 <= out6_01;
end                                                             {LINE 76}
always @(posedge ph4)                                           {LINE 77}
begin
    out6_00 <= out5_00;
    out2_10 <= curr[0];
    out3_01 <= out2_01;
end                                                             {LINE 82}
always @(posedge ph5)                                           {LINE 83}
begin
    out3_00 <= out2_00;
    out7_10 <= out6_10;
    out6_01 <= out5_01;
end                                                             {LINE 88}
always @(posedge ph6)                                           {LINE 89}
begin
    out7_00 <= out6_00;
    out5_10 <= out4_10;
    out2_01 <= curr[0];
end                                                             {LINE 94}
always @(posedge ph7)                                           {LINE 95}
begin
    out4_00 <= out3_00;
    out3_10 <= out2_10;
    out5_01 <= out4_01;
end                                                             {LINE 100}
always @(posedge ph1)                                           {LINE 101}
begin
    out2_11 <= curr[0];
    out3_11 <= out2_11;
    out4_11 <= out3_11;
    out5_11 <= out4_11;
    out6_11 <= out5_11;
    out7_11 <= out6_11;
end                                                             {LINE 109}
always @(sel1 or sel2                                           {LINE 110}
    or out2_00 or out3_00 or out4_00 or out5_00 or out6_00 or out7_00
    or out2_10 or out3_10 or out4_10 or out5_10 or out6_10 or out7_10
    or out2_01 or out3_01 or out4_01 or out5_01 or out6_01 or out7_01
    or out2_11 or out3_11 or out4_11 or out5_11 or out6_11 or out7_11)  {LINE 114}
begin                                                           {LINE 115}
    if (sel1 == 0 && sel2 == 0)
        begin
            out2 = out2_00;
            out3 = out3_00;
            out4 = out4_00;
```

TABLE 2-continued

```
        out5 = out5_00;
        out6 = out6_00;
        out7 = out7_00;
    end                                             {LINE 124}
    else if (sel1 == 1 && sel2 == 0)                {LINE 125}
    begin
        out2 = out2_10;
        out3 = out3_10;
        out4 = out4_10;
        out5 = out5_10;
        out6 = out6_10;
        out7 = out7_10;
    end                                             {LINE 133}
    else if (sel1 == 0 && sel2 == 1)                {LINE 134}
    begin
        out2 = out2_01;
        out3 = out3_01;
        out4 = out4_01;
        out5 = out5_01;
        out6 = out6_01;
        out7 = out7_01;
    end                                             {LINE 142}
    else if (sel1 == 1 && sel2 == 1)                {LINE 143}
    begin
        out2 = out2_11;
        out3 = out3_11;
        out4 = out4_11;
        out5 = out5_11;
        out6 = out6_11;
        out7 = out7_11;
    end                                             {LINE 151}
end
endmodule
```

Referring to Table 2 above, lines 1–13 establish a number of the parameters for the design, such as the input clock phases, output clock phases, programming selection bits and a reset signal. Line 14 assigns the least significant bit of the counter output to be the first output clock phase OUT1. Lines 15–20 establish that the present state output 15 of the counter 12 (FIG. 2) is to be reset at "001" upon assertion of the reset signal.

Lines 21–63 define the states of the multibit count signal 15 and preset signal 13 in accordance with the programming select bits SEL1, SEL2. Lines 21–30 are responsible for division by 2, lines 31–39 for division by 3, lines 40–50 for division by 5 and lines 51–63 for division by 7. For example, referring to lines 21–30, the clock divider 10 divides by 2 when both programming select bits SEL1, SEL2 are a logical 0. When the multibit count signal 15 is "001", the next preset signal 13 is "110", and when the multibit count signal 15 is "110", the next preset signal 13 is "001". Hence, in accordance with the foregoing discussion and with reference to FIGS. 2 and 3, it can be readily seen that the least significant bit LSB of the multibit count signal 15 is indeed the first output clock phase OUT1.

Referring again to Table 2, lines 65–109 are responsible for establishing the timing for the leading edges of the various output clock phases OUT1–OUT7 with respect to the leading edges of the various input clock phases $\phi 1$–$\phi 7$. Lines 65–70 establish these relationships with respect to the leading edge of the second input clock phase $\phi 2$, lines 71–76 for the third input clock phase $\phi 3$, lines 77–82 for the fourth input clock phase $\phi 4$, lines 83–88 for the fifth input clock phase $\phi 5$, lines 89–94 for the sixth input clock phase $\phi 6$, lines 95–100 for the seventh input clock phase $\phi 7$ and lines 101–109 for the first input clock phase $\phi 1$. For example, referring to lines 65–70, when the input select bits SEL1, SEL2 are both a logical 0 (for division by 2), intermediate clock phase OUT4_00 is clocked by the second input clock phase $\phi 2$ to produce intermediate clock phase OUT5_00 (see FIG. 3). Similarly, when the input select bits SEL1 and SEL2 are a logical 1 and 0, respectively (for division by 3), and the fifth intermediate clock phase OUT5_10 is a logical 1, the sixth intermediate clock phase OUT6_10 becomes a logical 1 upon the next leading edge of the second input clock phase $\phi 2$ (see FIG. 4). Further similarly, when the input select bits SEL1 and SEL2 are a logical 0 and 1, respectively (for division by 5), and the third intermediate clock phase OUT3_01 is a logical 1, the fourth intermediate clock phase OUT4_01 becomes a logical 1 upon the next leading edge of the second input clock phase $\phi 2$ (see FIG. 5).

Lines 110–151 are responsible for establishing the 4:1 multiplexing performed by the multiplexor 18 of the intermediate clock phases OUT2_mn, OUT3_mn, OUT4_mn, OUT5_mn, OUT6_mn, OUT7_mn from the multiphase signal generator 16 (FIG. 2). Lines 115–124 are responsible for this multiplexing function during division by 2, with lines 125–133 responsible during division by 3, lines 134–142 responsible during division by 5 and lines 143–151 responsible during division by 7.

Various other modifications and alterations in the structure and method of operation of this invention will be apparent to those skilled in the art without departing from the scope and spirit of this invention. Although the invention has been described in connection with the specific preferred embodiments, it should be understood that the invention as claimed should not be unduly limited to such specific embodiments. It is intended that the following claims define the scope of the present invention and that structures and methods within the scope of these claims and their equivalence be covered thereby.

What is claimed is:

1. A programmable multiphase clock divider for selectively frequency dividing a multiphase input clock to provide a lower-frequency, self-aligned, multiphase output clock, said clock divider comprising:

a frequency divider for receiving a first input clock phase at an input frequency and a programming signal and in accordance therewith providing a first output clock phase at an output frequency and an output control signal, wherein said output frequency is lower than said input frequency; and a clock generator, coupled to said frequency divider, for receiving said first input clock phase, said first output clock phase, said output control signal and a plurality of additional input clock phases at said input frequency and in accordance therewith providing a plurality of additional output clock phases at said output frequency, wherein said first input clock phase and said plurality of additional input clock phases together form a plurality of noncoincident input clock signals with a plurality of predetermined relative phase relationships between temporally adjacent ones thereof, and wherein said first output clock phase and said plurality of additional output clock phases together form a plurality of noncoincident output clock signals with each one thereof corresponding to a respective one of said plurality of noncoincident input clock signals, and further wherein said plurality of predetermined relative phase relationships is maintained between corresponding, temporally adjacent ones of said plurality of noncoincident output clock signals.

2. A clock divider as recited in claim 1, wherein said frequency divider comprises a counter for receiving a preset signal and said first input clock phase and in accordance therewith providing a multibit count signal, and wherein said first output clock phase comprises a portion of said multibit count signal.

3. A clock divider as recited in claim 2, wherein said frequency divider further comprises a combinational logic circuit, coupled to said counter, for receiving said multibit count signal and said programming signal and in accordance therewith providing said preset signal.

4. A clock divider as recited in claim 1, wherein said clock generator comprises a multiphase signal generator for receiving said first input clock phase, said first output clock phase and said plurality of additional input clock phases and in accordance therewith providing a plurality of intermediate clock phases.

5. A clock divider as recited in claim 4, wherein said plurality of intermediate clock phases includes multiple subpluralities of selected clock phases, each of which is synchronous with one of said plurality of input clock phases.

6. A clock divider as recited in claim 4, wherein said multiphase signal generator comprises a plurality of signal sampling elements for sampling said first output clock phase in accordance with a first subplurality of said plurality of input clock phases to provide a plurality of sampled clock phases and for successively further sampling said plurality of sampled clock phases in accordance with further subpluralities of said plurality of input clock phases, and wherein said plurality of intermediate clock phases comprises said sampled clock phases.

7. A clock divider as recited in claim 4, wherein said clock generator further comprises a multiplexor, coupled to said multiphase signal generator, for receiving said plurality of intermediate clock phases and said output control signal and in accordance therewith providing said plurality of additional output clock phases.

8. A method of providing a programmable multiphase clock divider for selectively frequency dividing a multiphase input clock to provide a lower-frequency, self-aligned, multiphase output clock, said method comprising the steps of:

providing a frequency divider for receiving a first input clock phase at an input frequency and a programming signal and in accordance therewith providing a first output clock phase at an output frequency and an output control signal, wherein said output frequency is lower than said input frequency; and providing a clock generator, for coupling to said frequency divider, for receiving said first input clock phase, said first output clock phase, said output control signal and a plurality of additional input clock phases at said input frequency and in accordance therewith providing a plurality of additional output clock phases at said output frequency, wherein said first input clock phase and said plurality of additional input clock phases together form a plurality of noncoincident input clock signals with a plurality of predetermined relative phase relationships between temporally adjacent ones thereof, and wherein said first output clock phase and said plurality of additional output clock phases together form a plurality of noncoincident output clock signals with each one thereof corresponding to a respective one of said plurality of noncoincident input clock signals, and further wherein said plurality of predetermined relative phase relationships is maintained between corresponding, temporally adjacent ones of said plurality of noncoincident Output clock signals.

9. A clock divider as recited in claim 8, wherein said step of providing a frequency divider comprises providing a counter for receiving a preset signal and said first input clock phase and in accordance therewith providing a multibit count signal, and wherein said first output clock phase comprises a portion of said multibit count signal.

10. A clock divider as recited in claim 9, wherein said step of providing a frequency divider further comprises providing a combinational logic circuit, coupled to said counter, for receiving said multibit count signal and said programming signal and in accordance therewith providing said preset signal.

11. A clock divider as recited in claim 8, wherein said step of providing a clock generator comprises providing a multiphase signal generator for receiving said first input clock phase, said first output clock phase and said plurality of additional input clock phases and in accordance therewith providing a plurality of intermediate clock phases.

12. A clock divider as recited in claim 11, wherein said plurality of intermediate clock phases includes multiple subpluralities of selected clock phases, each of which is synchronous with one of said plurality of input clock phases.

13. A clock divider as recited in claim 11, wherein said step of providing a multiphase signal generator comprises providing a plurality of signal sampling elements for sampling said first output clock phase in accordance with a first subplurality of said plurality of input clock phases to provide a plurality of sampled clock phases and for successively further sampling said plurality of sampled clock phases in accordance with further subpluralities of said plurality of input clock phases, and wherein said plurality of intermediate clock phases comprises said sampled clock phases.

14. A clock divider as recited in claim 11, wherein said step of providing a clock generator further comprises providing a multiplexor, coupled to said multiphase signal generator, for receiving said plurality of intermediate clock phases and said output control signal and in accordance therewith providing said plurality of additional output clock phases.

15. A method for programmably frequency dividing a multiphase input clock to provide a lower-frequency, self-aligned, multiphase output clock, said method comprising the steps of:

receiving a plurality of input clock phases at an input frequency;

receiving a programming signal;

providing a first output clock phase at an output frequency in accordance with said programming signal and one of said plurality of input clock phases, wherein said output frequency is lower than said input frequency;

providing an output control signal in accordance with said programming signal; and providing a plurality of additional output clock phases at said output frequency in accordance with said first output clock phase, said output control signal and said plurality of input clock phases, wherein said first input clock phase and said plurality of additional input clock phases together form a plurality of noncoincident input clock signals with a plurality of predetermined relative phase relationships between temporally adjacent ones thereof, and wherein said first output clock phase and said plurality of additional output clock phases together form a plurality of noncoincident output clock signals with each one thereof corresponding to a respective one of said plurality of noncoincident input clock signals and further wherein said plurality of predetermined relative phase relationships is maintained between corresponding, temporally adjacent ones of said plurality of noncoincident output clock signals.

16. A method as recited in claim 15, wherein said step of providing a first output clock phase comprises receiving a preset signal and said first input clock phase and in accordance therewith providing a multibit count signal and outputting a portion of said multibit count signal as said first output clock phase.

17. A method as recited in claim 16, wherein said step of providing a first output clock phase further comprises receiving said multibit count signal and said programming signal and in accordance therewith providing said preset signal.

18. A method as recited in claim 15, wherein said step of providing a plurality of additional output clock phases comprises providing a plurality of intermediate clock phases in accordance with said first output clock phase and said plurality of input clock phases.

19. A method as recited in claim 18, wherein said step of providing a plurality of intermediate clock phases comprises providing multiple subpluralities of selected clock phases, each of which is synchronous with one of said plurality of input clock phases.

20. A method as recited in claim 18, wherein said step of providing a plurality of intermediate clock phases comprises:

sampling said first output clock phase in accordance with a first subplurality of said plurality of input clock phases to provide a plurality of sampled clock phases;

successively further sampling said plurality of sampled clock phases in accordance with further subpluralities of said plurality of input clock phases; and outputting said sampled clock phases as said plurality of intermediate clock phases.

21. A method as recited in claim 18, wherein said step of providing a plurality of additional output clock phases further comprises multiplexing said plurality of intermediate clock phases in accordance with said output control signal.

\* \* \* \* \*

UNITED STATES PATENT AND TRADEMARK OFFICE
CERTIFICATE OF CORRECTION

PATENT NO. : 5,477,181
DATED : December 19, 1995
INVENTOR(S) : Gabriel Li, Wong Hee It is certified that error appears in the above-indentified patent and that said Letters Patent is hereby corrected as shown below:

In Col. 12, line 26, please change "Output" to --output--; and
    In Col. 13, line 22, please change "signals" to --signals,--.

Signed and Sealed this

Fourteenth Day of May, 1996

*Attest:*

BRUCE LEHMAN

*Attesting Officer*    *Commissioner of Patents and Trademarks*